(12) United States Patent
Carberry

(10) Patent No.: US 7,604,696 B2
(45) Date of Patent: Oct. 20, 2009

(54) METHOD OF MAKING A SOLAR GRADE SILICON WAFER

(76) Inventor: John Carberry, 2914 Lake Foest Cir., Talbott, TN (US) 37877

( * ) Notice: Subject to any disclaimer, the term of this patent is extended or adjusted under 35 U.S.C. 154(b) by 98 days.

(21) Appl. No.: 11/689,294

(22) Filed: Mar. 21, 2007

(65) Prior Publication Data

US 2008/0233720 A1 Sep. 25, 2008

(51) Int. Cl.
*C30B 11/04* (2006.01)
(52) U.S. Cl. .............. 117/3; 117/4; 422/245.1; 438/492; 438/500
(58) Field of Classification Search .............. 117/3, 117/4; 422/245.1; 264/1; 438/492, 500
See application file for complete search history.

(56) References Cited

U.S. PATENT DOCUMENTS

| | | | |
|---|---|---|---|
| 5,431,869 A | * | 7/1995 | Kumar et al. .................. 264/85 |
| 6,013,236 A | * | 1/2000 | Takahashi et al. ............ 423/345 |
| 2004/0048411 A1 | | 3/2004 | Nishida |
| 2004/0055909 A1 | | 3/2004 | Lee et al. |
| 2005/0145176 A1 | | 7/2005 | Wicker |
| 2006/0142143 A1 | | 6/2006 | Abrevaya et al. |
| 2006/0107769 A1 | | 10/2006 | Parthasarathy et al |

FOREIGN PATENT DOCUMENTS

CN 101244823 A * 8/2008

* cited by examiner

*Primary Examiner*—Felisa C Hiteshew
(74) *Attorney, Agent, or Firm*—Pitts & Brittian, PC

(57) ABSTRACT

A method of making a solar grade silicon wafer is disclosed. In at least some embodiments of this invention, the method includes the follow steps: providing a slurry including a liquid that essentially prevents the oxidation of silicon powder and a silicon powder that is essentially free of oxides; providing a solar grade wafer mold defining an interior for receiving the slurry; introducing the slurry into the solar grade wafer mold; precipitating the silicon powder from the slurry to form a preform of the solar grade silicon wafer; and crystallizing the preform to make the solar grade silicon wafer.

8 Claims, 5 Drawing Sheets

METHOD OF MAKING A SOLAR GRADE SILICON WAFER

CROSS-REFERENCE TO RELATED APPLICATIONS

Not Applicable

STATEMENT REGARDING FEDERALLY-SPONSORED RESEARCH OR DEVELOPMENT

Not Applicable

BACKGROUND OF THE INVENTION

1. Field of Invention

This invention relates to a method for making solar grade silicon wafers.

2. Description of the Related Art

Silicon crystal wafers for solar cells typically are made by heating, melting, and crystallizing essentially pure lumps of silicon. In a typical example, the silicon lumps are placed and packed in a solar grade wafer mold ("mold") made of rebonded fused silica. Thereafter, the mold, which sometimes is called a "crucible," is loaded into a vacuum furnace that has heating elements that are usually made of graphite. The vacuum furnace heats the silicon lumps, causing them to melt. Thereafter, the melted silicon is cooled in a manner that encourages the formation of the silicon crystal wafers. This method has its limitations, and some of these are described below.

The length of the heating-cooling cycle often is 45-60 hours, and this can constrain production. One factor in determining the length of the heating-cooling cycle is the time required to heat the silicon feedstock sufficiently to cause it to melt. The silicon lumps used are typically very coarse, as they have an average size of approximately thirty (30) millimeters. The reason such coarse materials are used is to preserve purity in the melted silicon. It has been found that the process of diminution smears undesirable contaminants onto the surface of the silicon. The packing density of such lumps in the mold is approximately thirty-five (35) percent of perfect packing, which is significantly less than ideal. Consequently, heat is not conducted efficiently through such a feedstock, and additional heating time is required. Given that (1) the heating elements are on the outside of the crucible, (2) the silicon lumps have relatively little physical contact with one another, and (3) the silicon lumps "shadow" one another very heavily; most of the heating occurs by radiation that is accomplished in succession, wherein a relatively exposed silicon lump is heated and that lump then radiates heat to one or more relatively unexposed lumps, i.e., one or more silicon lumps that are "shadowed." In many instances, a partial pressure of argon gas is used to assist in transferring heat to the silicon feedstock.

During the heating step and the cooling step, two impurities, i.e., silicon carbide (SiC) and dissolved-oxygen complexes (including silicon-oxygen complexes), are produced in the silicon feedstock. These impurities cause a reduction in the yield of usable silicon crystal wafers that can be as high as approximately forty (40) percent. Also, these impurities cause defects in the crystal structure that reduce the efficiency and life of the resulting solar cell. A further yield loss is incurred also by the sawing and slicing of the billet into wafers. After the surface impurities of SiO, $SiO_2$, and SiC are removed, then the remaining billet is cut up to allow slicing.

In at least some instances, by the time the impurities are removed and the wafers are sliced down to 150-200 microns, the yield on starting silicon can be as low as 35%. At least a few factors encourage the synthesis of these impurities. First, the high temperatures achieved in the furnace promote the oxidation of its graphite heating elements by reduction of the fused silica with which the graphite is in physical contact, thus creating a partial pressure of CO and $CO_2$. Other components of the vacuum furnace may be composed of graphite as well, including the insulation material, and likewise, may too be oxidized. This oxidation-reduction reaction commonly yields two gases: carbon monoxide (CO) and carbon dioxide ($CO_2$). These gases then react with the silicon feedstock in the mold to yield silicon carbide and dissolved-oxygen complexes. Second, although rebonded fused silica is a very refractory substance, it is permeable by carbon oxide gases (e.g., CO and $CO_2$). Thus, carbon oxide gases access the silicon feedstock by permeating the mold. Third, the packing density of the silicon lumps results in spaces that can be permeated and/or occupied by the carbon oxide gases. The surfaces of the silicon lumps that border these spaces serve as additional loci for the oxidation-reduction reaction that yields silicon carbide and dissolved-oxygen complexes. Finally, it must be acknowledged that vacuum furnaces generally do not create perfect vacuums, allowing atmospheric gases and potentially other gases to enter. Atmospheric gases include oxidizing agents that, as described previously, can result in the production of impurities.

BRIEF SUMMARY OF THE INVENTION

The present invention is a method of making solar grade silicon wafers. In at least some embodiments of this invention, the method includes the follow steps: providing a slurry including a liquid that essentially prevents the oxidation of silicon powder and a silicon powder that is very fine and essentially free of oxides and other harmful impurities; providing a solar grade wafer mold defining an interior for receiving the slurry; introducing the slurry into the solar grade wafer mold; precipitating the silicon powder from the slurry to form a preform of the solar grade silicon wafer; and crystallizing the preform to make the solar grade silicon wafer. In some embodiments of this invention, the solar grade wafer mold or a preform thereof is treated with a pore-occluding agent and/or a degassing agent to further aid in reducing the presence of impurities in the resulting solar grade silicon wafers.

The advantages derived from practicing any one of the various embodiments of the present invention include at least one of the following: (1) higher packing density for silicon, thereby encouraging melting while discouraging the accumulation and/or formation of harmful impurities in the melt; (2) quicker heating, thus resulting in less contamination by SiO, SiC, and $SiO_2$; (3) higher efficiency and yield due to shorter side-to-side path; (4) higher yield due to (a) less contamination by SiC, SiO, $SiO_2$, (b) less trimming, and (c) the elimination of sawing; (5) higher yield and efficiency due to the ability to make net-shaped solar grade silicon wafers as thin as 50 microns; and (6) wafers having a larger surface area due to relatively unrestricted processing.

BRIEF DESCRIPTION OF THE SEVERAL VIEWS OF THE DRAWINGS

The above-mentioned features of the invention will become more clearly understood from the following detailed description of the invention read together with the drawings in which.

DETAILED DESCRIPTION OF THE INVENTION

The present invention, i.e., the method of making a solar grade silicon wafer, is described more fully hereinafter. From the outset, it is worth noting that this invention may be embodied in many different forms and should not be construed as limited to the specific embodiments described herein.

Definitions

"Carbide" refers to a binary compound of carbon with an element more electropositive than carbon.

"Ceramic" means of or relating to a product made essentially from a nonmetallic substance by firing at a high temperature.

"Cure" means to prepare or alter especially by chemical or physical processing for preserving, perfecting, or readying for use (e.g., to fix in a desired position as by heating).

"Feedstock" refers to the raw material furnished to a machine or process.

"Oxidation" refers to the act or process of oxidizing.

"Oxide" refers to a binary compound of oxygen with a more electropositive element or group.

"Oxidize" means (1) to combine with oxygen, (2) to dehydrogenate especially by the action of oxygen, (3) to change (a compound) by increasing the proportion of the electronegative part, (4) to change (an element or ion) from a lower to a higher positive valence, or (5) to remove one or more electrons from an atom, an ion, a molecule, or a radical.

"Porosity" refers to either (1) the property of a solid that contains minute channels or open spaces or (2) the ratio of the volume of interstices of a material to the volume of its mass.

"Preform" refers to an object that has been subjected to preliminary, usually incomplete shaping or molding before undergoing complete or final processing.

"Sinter" means to cause to become a coherent bonded mass by heating without melting.

"Slurry" refers to a free-flowing, pumpable suspension of fine solid material in liquid.

"Wetting agent" refers to a substance that (1) increases the rate at which a liquid spreads across a surface when it is added to the liquid in small amounts or (2) renders a surface nonrepellant to a wetting liquid.

Other terms are defined as necessary in the detailed description that follows.

Method of Making a Solar Grade Silicon Wafer

Figure 1:
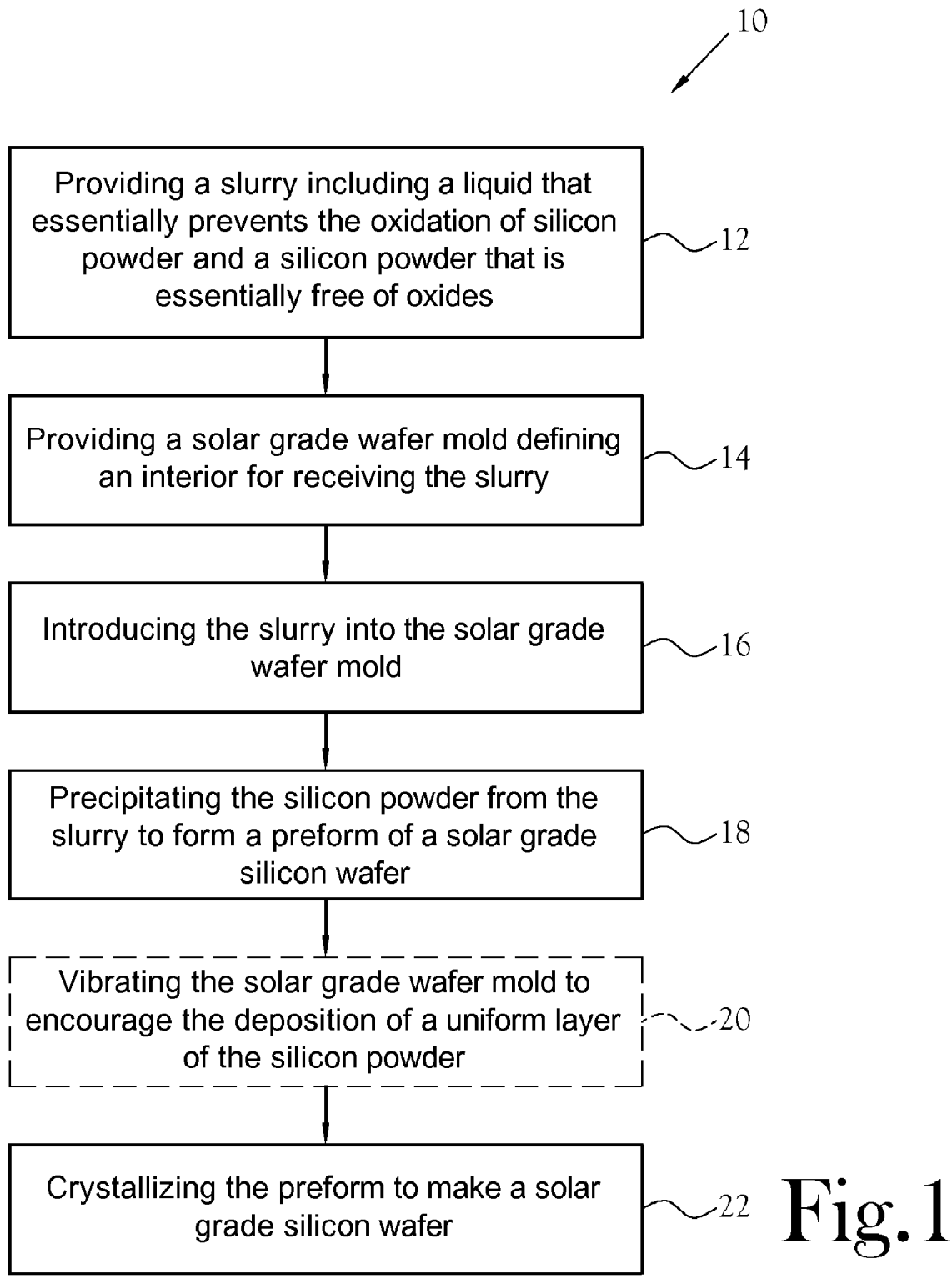
FIG. 1 is a flowchart showing the steps (including one optional step) involved in making a solar grade silicon wafer, in accordance with one of the embodiments of the present invention.

FIG. 1 is a flowchart 10 that shows an embodiment of the method of making a solar grade silicon wafer. This embodiment includes an optional step 20. As shown at 12, a slurry is provided that includes (1) a silicon powder that is essentially free of oxides and other harmful impurities and (2) a liquid that essentially prevents the oxidation of silicon powder. The absence or near absence of oxides (e.g., silica ($SiO_2$)) and other harmful impurities in or on the silicon powder prevents sintering, which adversely affects the manufacture of solar grade silicon wafers. A symptom of sintering is that a higher temperature is required to melt the silicon powder, further encouraging the oxidation-reduction reaction that yields both silicon carbide and the dissolved-oxygen complexes (including silicon-oxygen complexes). These are the two impurities introduced previously in the Description of the Related Art. In at least some embodiments of the present invention, the silicon powder component of the slurry consists essentially of silicon particles having an average size of less than, or equal to, approximately twelve (12) microns. The advantages of this particle size are described later in this specification. During at least one of the steps of the present invention, the liquid component of the slurry prevents or nearly prevents the oxidation of the silicon powder. Accordingly, the synthesis of carbides (e.g., SiC) is discouraged as well. In at least one embodiment of the present invention, the liquid component of the slurry consists essentially of pure water-free ethanol.

A method of producing oxide-free silicon powder is disclosed in U.S. Pat. No. 6,638,491, which was issued to Carberry. That method can be used for producing the silicon powder component of the slurry. In this instance, for example, the milling of the silicon under alcohol using zirconia paddles, linings and media assures not only that any grinding-based or attrition-based contamination is minimal, but that the grain size of the milled silicon is very small, i.e., typically being less than 300 nanometers and having a similar lattice structure and being non-conductive. Once the slurry is prepared, it can be melted and recast in a solar grade wafer mold (e.g., graphite boat). Optionally, the interior surface of the solar grade wafer mold has been modified, thereby yielding a modified interior surface that (1) essentially does not react with silicon and (2) has a lattice or crystal structure similar to that of silicon. Such modification can be accomplished using sputtering, chemical vapor deposition (CVD), ion implantation, or metallizing. The purpose of the modification is to aid in orienting the silicon as it crystallizes. Differential cooling can be caused from the bottom of the solar grade wafer mold, thereby orienting the crystals to grow from one side to the other. In these instances, it is desirable that the grain boundaries between one side of a thin wafer and the other be minimized to allow greater efficiency of conversion of photons to electrons. The advantages offered thereby include: (1) higher packing density for melting without harmful impurities; (2) quicker heating, thus resulting in less contamination by SiO, SiC, and $SiO_2$; (3) higher efficiency and yield due to shorter side-to-side path; (4) higher yield from as low as 30% to as high as 98% due to (a) less contamination by SiC, SiO, $SiO_2$, (b) less trimming, and (c) elimination of sawing; (5) higher yield and efficiency due to processing ability to make net shape thin wafers typically as thin as 50 microns; and (6) larger wafers due to relatively unrestricted processing with regard to size, thus enabling much higher aerial yield on such limited real estate such as rooftops, car tops, etc. For instance, current technology is limited to producing a solar wafer having a length of approximately 15 centimeters and a width of approximately 15 centimeters (approximately 225 $cm^2$). The present invention could enable manufacture of a solar wafer having a length of approximately one meter and a width of approximately one meter (approximately 1.0 $m^2$), thereby reducing or eliminating the wafer-to-wafer space losses.

FIG. 1 shows at 14 that a solar grade wafer mold ("mold") must be provided. Such molds are known to those skilled in the art and generally are composed of rebonded fused silica, graphite, silicon nitride, boron nitride, or any combination thereof. In accordance with 16 of FIG. 1, the slurry is introduced into the mold. In some embodiments, at least part of the interior surface of the mold is treated with a wetting agent. For example, any part that is likely to be in contact with the slurry may be treated. This treatment, in encouraging the slurry to spread across the interior surface of the mold, aids in ensuring that the final product, i.e., the solar grade silicon wafer, is properly formed. In some of the embodiments that include treatment with a wetting agent, the wetting agent is silicon nitride. In other such embodiments, the wetting agent is boron nitride. Either silicon nitride or boron nitride is desirable because neither reacts with the slurry nor the mold.

As shown at 18 of FIG. 1, the silicon powder is precipitated from the slurry to form a preform of the solar grade silicon wafer at the bottom of the mold. Such precipitations are known to those skilled in the art. For example, the liquid component of the slurry may be evaporated to encourage the precipitation of the silicon powder from the slurry. In one embodiment of the present invention, as shown in optional step 20 of FIG. 1, the mold is vibrated during the precipitation step to encourage the deposition of a uniform layer of the silicon powder. This aids in ensuring that the final product has a uniform thickness. Additionally or alternatively, freeze casting can be used, thus further restricting the oxidation of the silicon.

Next, as shown at 22 of FIG. 1, the preform of the solar grade silicon wafer is crystallized to make the solar grade silicon wafer. Such crystallizations are known to those skilled in the art and one such crystallization method is briefly summarized in the Description of the Related Art. In those embodiments of the present invention in which the silicon powder component of the slurry consists essentially of silicon particles having an average size of less than, or equal to, approximately twelve (12) microns, the preform that results is relatively dense. In those embodiments, the packing density of the preform is approximately seventy-five (75) percent, resulting in lower permeability and higher thermal conductivity. The lower permeability reduces the percentage of the preform's internal surface area that is accessible to carbon oxide gases, thereby reducing the number of loci available for the oxidation-reduction reaction that yields silicon carbide and the dissolved-oxygen complexes. The higher thermal conductivity permits a reduction in the length of the heating-cooling cycle, further limiting the synthesis of those impurities.

Figure 2:
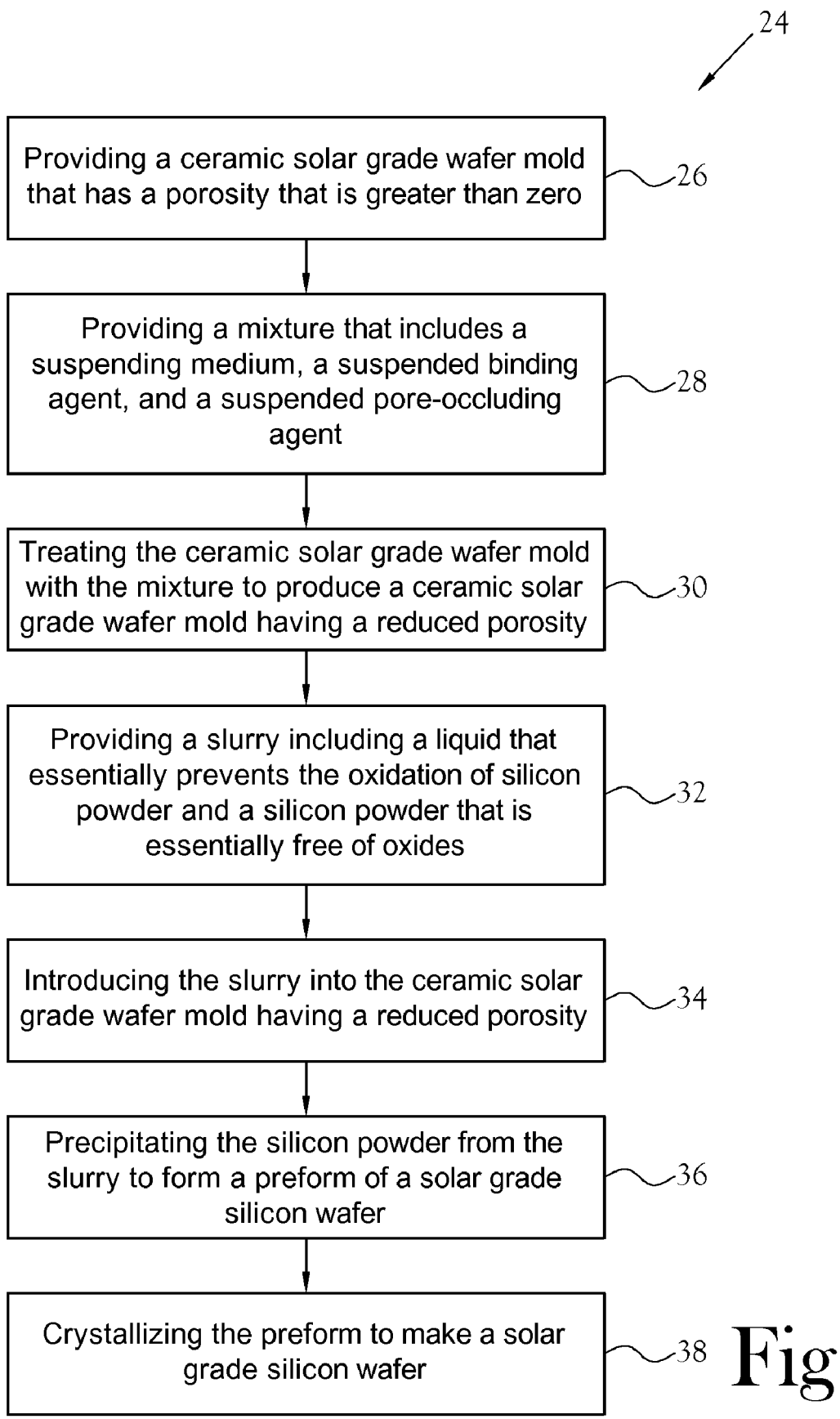
FIG. 2 is a flowchart showing the steps involved in making a solar grade silicon wafer, in accordance with another embodiment of the present invention.

FIG. 2 is a flowchart 24 that shows another embodiment of the method of making a solar grade silicon wafer. As shown at 30 of FIG. 2, in this embodiment of the invention, the mold is treated with a mixture to reduce its permeability with respect to oxidizing agents, especially gaseous oxidizing agents. As stated previously in the Description of the Related Art, the high temperatures achieved in the furnace promote the oxidation of at least some of its graphite components (e.g., graphite heating elements). This oxidation results in the synthesis of one or more gaseous oxidizing agents (e.g., CO and $CO_2$), which can access the silicon feedstock by permeating the mold. Those skilled in the art will recognize that the chemical formula of each of the gaseous oxidizing agents does not necessarily include an oxygen atom, and that the variety and identity of the gaseous oxidizing agents can vary, one factor being the chemical composition of various components of the vacuum furnace. Those skilled in the art will recognize also that graphite components, among other vacuum furnace components, can be oxidized by agents originating from a variety of sources, including the sources set forth in the Description of the Related Art and, in some instances, the reduction of one or more substances of the mold, itself.

FIG. 2 shows at 26 that a ceramic solar grade wafer mold that has a porosity greater than zero must be provided. In at least some embodiments, the ceramic solar grade wafer mold is composed of one or more substances, at least one of which is rebonded fused silica, graphite, boron nitride, or silicon nitride. As shown at 28 of FIG. 2, a mixture must be provided that includes a suspending medium, a suspended binding agent, and a suspended pore-occluding agent. In some embodiments, the suspending medium consists essentially of ethanol, and those skilled in the art will recognize that one or more other chemicals may be suitable for use as a suspending medium. In some embodiments, the suspended binding agent consists essentially of tetraethyl orthosilicate, colloidal silica, or any combination thereof. Finally, in some embodiments, the suspended pore-occluding agent consists essentially of zircon, silica, silicon nitride, or any combination thereof. Thereafter, as shown at 30 of FIG. 2, the ceramic solar grade wafer mold is treated with the mixture to produce a ceramic solar grade wafer mold having a reduced porosity. This treatment can vary, however. In one variation, the ceramic solar grade wafer mold is submerged in the mixture for a fixed length of time. In another variation, one or more surfaces of the ceramic solar grade wafer mold are coated with the mixture. In all variations, however, the occlusion of at least some of the pores reduces the ability of oxidizing agents to access the silicon feedstock by permeating the mold.

The remaining four mandatory steps, as shown at 32, 34, 26, and 38 of FIG. 2, are as follows: providing a slurry including a liquid that essentially prevents the oxidation of silicon powder and a silicon powder that is essentially free of oxides (see 32); introducing the slurry into the ceramic solar grade wafer mold having a reduced porosity (see 34); precipitating the silicon powder from the slurry to form a preform of the solar grade silicon wafer (see 36); and crystallizing the preform to make a solar grade silicon wafer (see 38).

The treatment of the ceramic solar grade wafer mold with the mixture provides an essentially passive barrier against oxidizing agents. In some embodiments, however, the mixture further includes a suspended degassing agent for converting certain gaseous oxidizing agents (i.e., carbon oxides) to carbides (e.g., SiC) and silicon oxides (e.g., $SiO_2$). The inclusion of the degassing agent in the mixture results in the addition of an active component to the barrier. The degassing agent reacts with carbon oxides to yield carbides and silicon oxides. Although carbides and silicon oxides are among the impurities that can adversely affect the manufacture of a solar grade silicon wafer, their synthesis in this instance is harmless because it occurs away from the silicon feedstock. In at least some embodiments, the suspended degassing agent consists essentially of silicon, silicon nitride, or any combination thereof.

Figure 3:
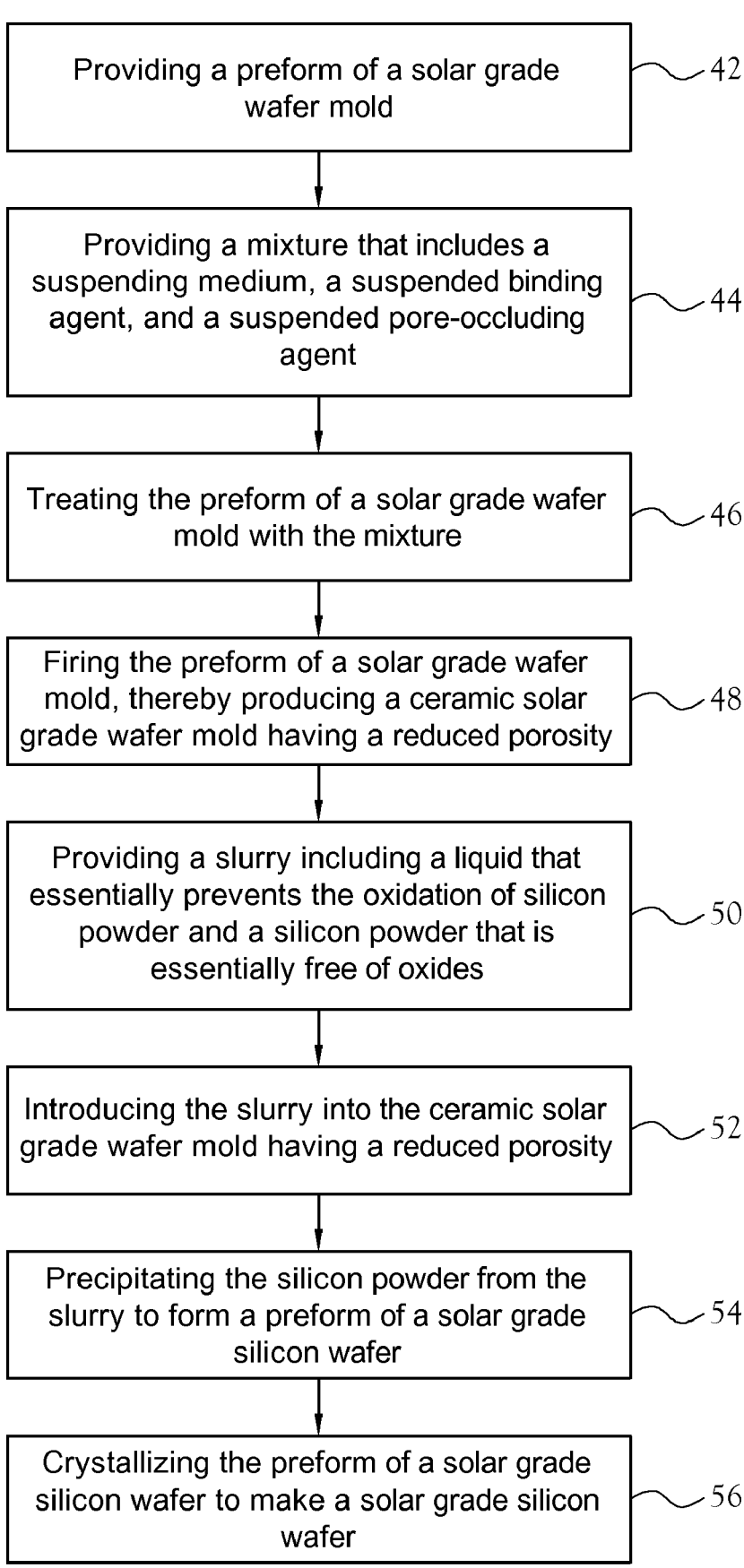
FIG. 3 is a flowchart showing the steps involved in making a solar grade silicon wafer, in accordance with still another embodiment of the present invention.

FIG. 3 is a flowchart 40 that shows still another embodiment of the method of making a solar grade silicon wafer. As shown at 42 of FIG. 3, a preform of a solar grade wafer mold must be provided. Additionally, as shown at 44, a mixture must be provided that includes a suspending medium, a suspended binding agent, and a suspended pore-occluding agent. Next, the preform is treated with the mixture (see 46) and, thereafter, the preform is fired to produce a ceramic solar grade wafer mold having a reduced porosity (see 48). In some embodiments, the preform of the solar grade wafer mold is cured to the extent necessary to substantially remove (e.g., evaporate) pre-existing moisture and/or binding agent to ready it for treatment with the mixture. The remaining steps, which are shown at 50, 52, 54, and 56 of FIG. 3, are analogous to their counterparts shown in FIG. 2.

Figure 4:
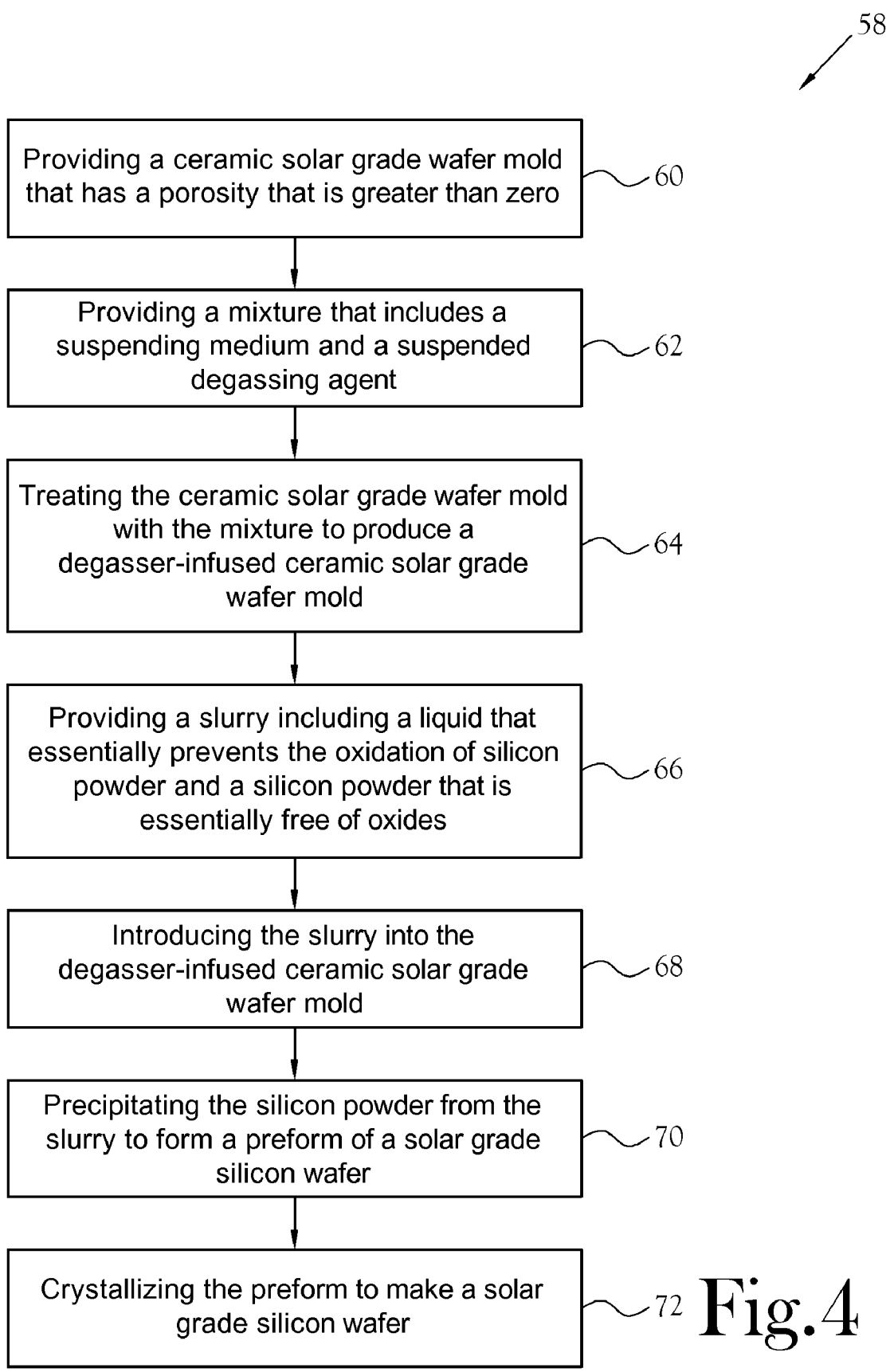
FIG. 4 is a flowchart showing the steps involved in making a solar grade silicon wafer, in accordance with yet still another embodiment of the present invention.

FIG. 4 is a flowchart 60 that shows still another embodiment. A distinguishing feature of this embodiment is that the mixture used to treat the ceramic solar grade wafer mold does not necessarily include a suspended binding agent, a suspended pore-occluding agent, or both. As shown at 60 of FIG. 4, a ceramic solar grade wafer mold is provided that has a porosity that is greater than zero. (By definition, a "ceramic" solar grade wafer mold already has been fired.) Additionally, as shown at 62 of FIG. 4, a mixture that includes a suspending medium and a suspended degassing agent is provided. In at least some embodiments, the suspended degassing agent can react with at least one type of carbon oxide to yield a carbide and a silicon oxide. Furthermore, in at least some embodiments, the suspended degassing agent consists of silicon, silicon nitride, or any combination thereof. Thereafter, in accordance with 64 of FIG. 4, the ceramic solar grade wafer mold is treated with the mixture to produce a degasser-infused ceramic solar grade wafer mold. This treatment can vary, however. In one variation, the ceramic solar grade wafer mold is submerged in the mixture for a fixed length of time. In another variation, one or more surfaces of the ceramic solar grade wafer mold are coated with the mixture. Also, as shown at 66, a slurry is provided that includes a liquid that essentially prevents the oxidation of silicon powder and a silicon powder that is essentially free of oxides. Thereafter, as shown at 68, 70, and 72 of FIG. 4, the following occurs: the slurry is introduced into the degasser-infused ceramic solar grade wafer mold (see 68); the silicon powder is precipitated from the slurry to form a preform of the solar grade silicon wafer (see 70); and the preform is crystallized to make the solar grade silicon wafer (see 72). At least during these three steps, an oxidizing agent can encounter the degassing agent as the former is attempting to permeate the mold. If such an encounter does occur, a reaction can ensue in which the oxidizing agent is converted to one or more chemicals that are less reactive (more stable) and, hence, pose less of a threat to the silicon feedstock. In some instances, an oxidizing agent may be converted to a less reactive oxidizing agent.

Figure 5:
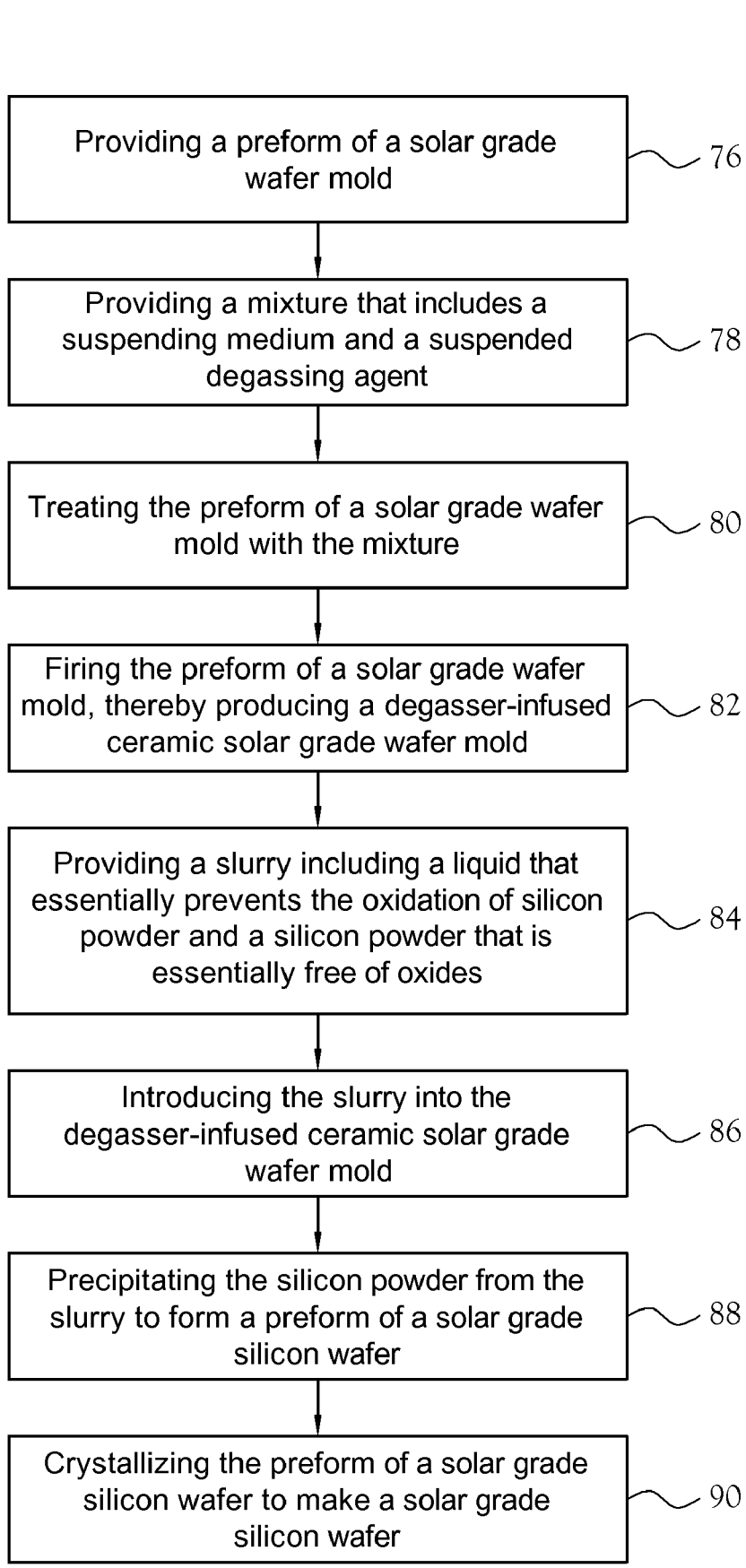
FIG. 5 is a flowchart showing the steps involved in making a solar grade silicon wafer in accordance with even still another embodiment of the present invention.

FIG. 5 is a flowchart 74 that shows still another embodiment. As shown at 76 of FIG. 5, a preform of a solar grade wafer mold must be provided. Additionally, as shown at 78, a mixture must be provided that includes a suspending medium and a suspended degassing agent. A feature that distinguishes this embodiment from that shown in FIG. 4 is that, in this embodiment, the mixture including the suspended degassing agent is used to treat a preform of solar grade wafer mold (see FIG. 5 at 80), as opposed to a ceramic solar grade wafer mold. Thereafter, as shown at 82 of FIG. 5, the preform of a solar grade wafer mold is fired to produce a degasser-infused ceramic solar grade wafer mold. The remaining steps, which are shown at 84, 86, 88, and 90 of FIG. 5, are analogous to their counterparts shown in FIG. 4.

While the present invention has been illustrated by description of several embodiments and while the illustrative embodiments have been described in detail, it is not the intention of the applicant to restrict or in any way limit the scope of the appended claims to such detail. Additional modifications will readily appear to those skilled in the art. The invention in its broader aspects is therefore not limited to the specific details, methods, and illustrative examples shown and described. Accordingly, departures may be made from such details without departing from the spirit or scope of applicant's general inventive concept.

Having thus described the aforementioned invention, what is claimed is:

1. A method of making a solar grade silicon wafer, said method comprising the steps of:
   providing a ceramic solar grade wafer mold that has a porosity that is greater than zero;
   providing a mixture that includes a suspending medium, a suspended binding agent, and a suspended pore-occluding agent;
   treating said ceramic solar grade wafer mold with said mixture to produce a ceramic solar grade wafer mold having a reduced porosity;
   providing a slurry including a liquid that essentially prevents the oxidation of silicon powder and a silicon powder that is essentially free of oxides;
   introducing said slurry into said ceramic solar grade wafer mold having a reduced porosity;
   precipitating said silicon powder from said slurry to form a preform of said solar grade silicon wafer; and
   crystallizing said preform to make said solar grade silicon wafer.

2. The method of claim 1 wherein said ceramic solar grade wafer mold is composed of one or more substances, said one or more substances including at least one substance selected from the group consisting of rebonded fused silica, graphite, boron nitride, and silicon nitride.

3. The method of claim 1 wherein said suspending medium consists essentially of ethanol.

4. The method of claim 1 wherein said suspended binding agent is selected from the group consisting of tetraethyl orthosilicate, colloidal silica, and any combination thereof.

5. The method of claim 1 wherein said suspended pore-occluding agent is selected from the group consisting of zircon, silica, silicon nitride, and any combination thereof.

6. The method of claim 1 wherein said mixture further includes a suspended degassing agent for reacting with carbon oxide to yield a carbide and a silicon oxide.

7. The method of claim 6 wherein said suspended degassing agent is selected from the group consisting of silicon, silicon nitride, and any combination thereof.

8. The method of claim 1 wherein said ceramic solar grade wafer mold defines an interior surface, at least part of said interior surface having a crystal structure similar to that of crystallized silicon.

\* \* \* \* \*